United States Patent [19]
Quilliam

[11] 4,405,402
[45] Sep. 20, 1983

[54] PIEZOELECTRIC/PYROELECTRIC ELEMENTS

[75] Inventor: Robert M. Quilliam, Chelmsford, England

[73] Assignee: The Marconi Company Limited, Chelmsford, England

[21] Appl. No.: 195,772

[22] Filed: Oct. 10, 1980

[30] Foreign Application Priority Data

Oct. 12, 1979 [GB] United Kingdom ............... 7935443

[51] Int. Cl.³ .................. B32B 31/20; H01G 7/02; H01L 41/22
[52] U.S. Cl. .................. 156/273.7; 29/25.35; 156/274.4; 156/274.8; 156/275.7; 156/308.2; 156/311; 310/800
[58] Field of Search ............ 156/83, 273.7, 274.4, 156/274.8, 275.5, 308.2, 311, 275.7; 310/800; 29/25.35

[56] References Cited

U.S. PATENT DOCUMENTS

| | | | |
|---|---|---|---|
| 3,458,915 | 8/1969 | Miller et al. | 29/25.35 |
| 3,610,969 | 10/1971 | Clawson et al. | 29/25.35 |

FOREIGN PATENT DOCUMENTS

| | | |
|---|---|---|
| 1046142 | 10/1966 | United Kingdom . |
| 1079134 | 8/1967 | United Kingdom . |
| 1298490 | 12/1972 | United Kingdom . |
| 1354865 | 5/1974 | United Kingdom . |
| 1355783 | 6/1974 | United Kingdom . |
| 1442277 | 7/1976 | United Kingdom . |
| 1450338 | 9/1976 | United Kingdom . |
| 1507707 | 4/1978 | United Kingdom . |

OTHER PUBLICATIONS

Research Disclosure by London Transport Executive, (Nov. 1979), No. 18715, pp. 627-628.

*Primary Examiner*—Michael G. Wityshyn
*Attorney, Agent, or Firm*—Spencer & Kaye

[57] ABSTRACT

Piezoelectric and pyroelectric elements made from polarized plastics substances such as polyvinylidene fluoride are of considerable interest in a number of fields. Unfortunately, they also suffer from a number of not insignificant drawbacks. Specifically, the maximum thickness of fully-polarized plastics film obtainable is often not sufficient to give the desired sensitivity.

A very satisfactory thick piezoelectric/pyroelectric element can, however, be made from these plastics films if, instead of using a single film which is itself thick, there is used a laminar stack of individually thin polarizable plastics films each such film being essentially in face-to-face contact with its two neighbors, and there being no significant gas space/pockets between any two adjacent films, the element being made by a method in which: the required number of films of the unpolarized but polarizable plastics substance is assembled together in the form of a multilayer sandwich adjacent individual films of which are essentially in face-to-face contact; the assembly is heated to a temperature somewhat below the deflection temperature of the plastics substance; while still hot, a polarizing electric field is applied across the assembly, from end face to end face; and while still applying the polarizing field, the assembly is allowed to cool down.

8 Claims, 1 Drawing Figure

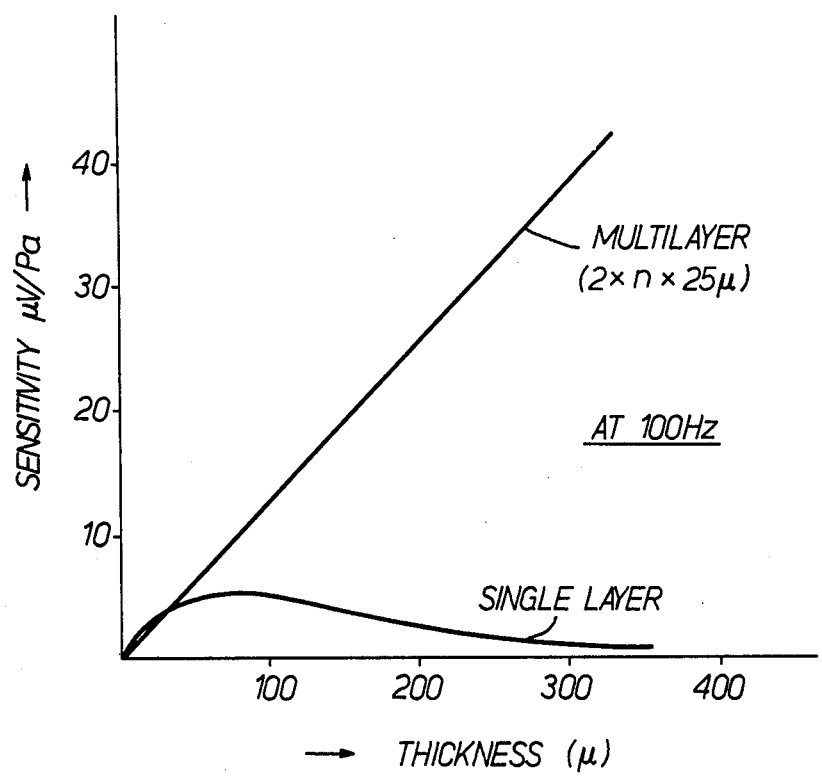

PIEZOELECTRIC/PYROELECTRIC ELEMENTS

BACKGROUND OF THE INVENTION (1) Field of the Invention

This invention concerns piezoelectric/pyroelectric elements, and relates in particular to a novel construction of such an element, together with a process for its production.

(2) Description of the Prior Art

A piezoelectric material is one that, in the form of an article of an appropriate physical shape, produces across itself an electric voltage when subjected to mechanical strain (and mechanically deforms itself when subjected to an electric field); a pyroelectric material is one where heating produces the electric voltage.

In each case the electric voltage is conventionally picked up, or the electric field conventionally applied, via a pair of electrodes mounted upon the article's two relevant faces. The original piezoelectric materials were all naturally-occurring anistropic crystals (for example, of quartz or Rochelle salt), but recently it has been discovered that certain plastics substances can be made into films or sheets having a "crystalline" form which can then be treated so as to become very strongly piezoelectric and/or pyroelectric. One particular such plastics substance is poly(vinyl difluoride)—also know as polyvinylidene fluoride, and referred to as $PVF_2$ or PVDF; thin films of partially $\beta$-phase PVDF can be made very strongly piezo- or pyroelectric by a process in which they are heated to near the "softening" temperature, placed in a strong polarising electric field, and then (while in the field) allowed to cool slowly back to room temperature. It is not yet fully understood exactly how this treatment causes the observed effects, but it is surmised that, at least in part, the polarising field causes the soft PVDF's electrically-asymetric molecules to re-align, that the state of alignment is retained when the PVDF cools and "sets", and that subsequent mechanical strain or heating causes a temporary distortion of the aligned molecules and a corresponding charge separation which results in the observed generated electric voltage.

Piezoelectric and pyroelectric elements made from polarised plastics substances such as PVDF are of considerable interest in a number of fields (a general discussion of polarised PVDF and its uses is in The Marconi Review, Fourth Quarter, 1976). Unfortunately, they also suffer from a number of not insignificant drawbacks.

For a number of applications it can be shown that the sensitivity of a fully-polarised plastics film piezoelectric element is in theory greater the thicker the film. Regrettably, however, the maximum thickness of fully-polarised plastics film obtainable is not sufficient—for many of these applications—to give the desired sensitivity. Full polarisation is achieved by applying the maximum possible polarising electric field; the limit of this field is that at which thermally-activated electrical breakdown occurs; and—as is typical for many insulator materials—the breakdown level decreases rapidly as the film thickness increases. The thickest fully-polarised plastics films currently available are about 50 microns thick—and this is simply not thick enough to give the desired sensitivity.

Rather surprisingly we have now found that a very satisfactory thick piezoelectric/pyroelectric element can be made from these plastics films if, instead of using a film which is itself thick, there is used a laminar stack of films which are themselves thin, the final element being formed by first constructing the stack from unpolarised films, and then polarising the whole stack in one, to make the desired element.

SUMMARY OF THE INVENTION

In one aspect, therefore, this invention provides a method for the formation of a piezoelectric/pyrolectric element comprising an electrically-polarised laminar stack of individually-thin polarisable plastics films, wherein each polarisable plastics film is essentially in face-to-face contact with its two neighbours, there being no significant gas space/pockets between any two adjacent films, in which method:

(a) the required number of films (or sheets) of the unpolarised but polarisable plastics substance is assembled together in the form of a multilayer sandwich adjacent individual films of which are essentially in face-to-face contact;

(b) the assembly is heated to a temperature somewhat below the deflection temperature of the plastics substance;

(c) while still hot, a polarising electric field is applied across the assembly, from end face to end face; and (d) while still applying the polarising field, the assembly is allowed to cool down.

In use, an element of this invention will of course be associated with electrodes suitably mounted at the stack end faces so as to allow the application or detection of the impressed or generated electric voltage.

Stack sensitivity appears to be directly related to stack thickness—and thus to the number of individual plastics films (or sheets) the stack contains. There seems to be no upper limit to the number of such films, save that for practical reasons it is at the moment rather difficult to make a stack containing a really large number of layers. Generally speaking, excellent results are obtained from stacks having from 6 to 20 layers (conveniently arranged as two opposed "half" stacks, as described hereinafter).

The plastics substance used to make the films from which the stack is formed may be any of those substances used, or suggested for use, in piezoelectric/pyroelectric elements. A particularly preferred plastics substance is the aformentioned polyvinylidene fluoride—PVDF—especially in its partly $\beta$-phase form, though other materials, for example polyvinyl fluoride (PVF), can be employed.

The thickness of the films (or sheets) used to make the stack depends rather on the polarisability of that substance. Thus, it is generally convenient to use thick films rather than thin films (for reasons mainly of ease of handling), but the films should not be so thick that the polarisability of any individual film is significantly low because of its thickness. For PVDF films, for example, an individual film thickness of about 25 micron ($25 \times 10^{-6}$ meter) is considered desirable (at such a thickness the film can be handled with reasonable ease, and the polarisability has not really begun to fall off; though film thicknesses down to 15 micron and up to 50 micron are still acceptable.

Because even the thinnest layer of gas between the films results in their acoustic decoupling, it is a requirement that adjacent films in the stack be essentially in contact, with no significant gas space/pockets between them. Thus, the thickness of any gas layer should be considerably smaller than the expected movement of the adjacent piezoelectric film associated with acoustic propagation. In general the magnitude of this movement will be of the order of a few angstroms ($10^{-10}$ meter) for low level reception, and a few thousand angstroms ($10^{-7}$ meter) for high power transmission.

Although it might be possible to construct a stack from films (or sheets) that have already been polarised, it is a feature of the invention that the stack be polarised after it has been constructed. Indeed, subsequent polarisation is particularly advantageous having regard to the methods presently employed for polarising films of this type (in which the electrodes that the polarised film piezoelectric/pyroelectric element will require to make it useful as or in a device are applied to the film before polarisation, and then used to supply the polarising field); polarising the formed stack necessitates only two electrodes (one at either end), and obviates the rather awesome task of stripping the polarising electrodes off individual films before stack construction, and of ensuring correct registration of the polarised areas in every film.

While any stack only needs—as aforesaid—two electrodes (one at either end), it is preferred to construct each stack as two "half" stacks joined end-to-end in opposition. In such a case each stack has three electrodes—one at either end and one in the middle. This minimises stray capacitance and provides good electrical shielding, and stacks so formed are particularly useful, when provided with a backing of an acoustically-reflective material such as brass, as acoustic receivers or generators, especially under water. Naturally, other electrode combinations are perfectly possible, and there can be envisaged a whole series of mini stacks joined end-to-end, each in opposition to its neighbour, with the appropriate inter-stack electrodes. Such a mini stack combination acts mechanically in series but is electrically connected in parallel; it may be of value as a high capacitance transducer, particularly for generating low frequency ultrasound.

In order to ensure that the collocation of unpolarised films is properly assembled, without significant air spaces or bubbles between adjacent layers, it is desirable to subject the assembly to considerable pressure across its end faces—of the order of from 1 to 5 tons per square inch (roughly from 200 to 1500 kg/cm$^2$), for example. This pressure is desirably maintained throughout the entire process of heating, polarising and cooling.

It is possible, moreover, that in certain cases the pressure has an additional benefit. One probable mechanism operating during polarisation of a PVDF stack is the conversion of $\alpha$-phase PVDF into the aligned $\beta$-phase. This transformation involves an increase in chain length, and any process tending to aid the lateral expansion of the chains during polarising may well facilitate the polarising process. The uniaxial pressure exerted by the press may aid this process by causing slight sideways extrusion of the material during polarisation.

Certain suitable plastics substances may be inherently self-adhesive (possibly because of additives, such as plasticisers, blended therewith). Others may soften sufficiently to "weld" (though not so much as to form a homogenous whole) under the pressure and heating stages. Films of these types of plastics may therefore be assembled together into stacks without additional adhesive. PVDF as currently available, however, appears to belong to neither of these groups, and therefore it is presently necessary to "glue" PVDF and like films together so that the constructed piezoelectric/pyroelectric element remains physically stable and in one piece. However, the choice of glue is not a random matter, for it appears that some glues may not provide a constructed stack with the required polarisability. At this time it is not entirely clear why some glues are satisfactory while others are not, but the following points seem to be useful in determining which are which:

(i) Although most glues are essentially insulators, nevertheless the more useful glues seem to be those which exhibit a small (probably ionic) conductivity at the polarisation temperature. This conductivity may be essential to the polarisation process (since otherwise no polarisation current could flow), so that highly non-conductive glues might be expected to be unsuitable. Furthermore, it is possible that the glue provides a degree of lateral conduction which helps to stabilise the potential across each layer, so reducing the possibility of thermally-activated electrical breakdown (in which high current channels are formed) and lowering the breakdown field limit.

(ii) Many plastics substances are "swollen" by conventional organic solvents (such as alcohols, ketones and esters), and this has some definite effect on their physical nature. For example, it has been found that some solvents, particularly ketones, will induce a limited conductivity in PVDF that appears to facilitate polarisation (this may occur either by causing ionic conduction within the material or by swelling the structure in such a way as to help rotation of polar groups or pressure-caused chain extrusion). The residual solvent content of the laminating glue may permeate the film causing modifications of the above type which are favourable to the polarisation process.

From these two comments it will be seen that more acceptable results appear most likely if the glue is not highly non-conductive, and if the glue—or the solvents it is employed with—causes swelling of the plastics film.

There are, in addition, two other very important criteria that any glue must meet—namely, it must be compatible with the plastics substance being glued, and it must be capable of being applied as a very thin layer (no more than 1 or 2 microns thick when dry). Finally, for purely practical reasons regarding ease of handling, the glue employed is most conveniently one that dries in place to a non-tacky layer than can be re-activated (made "gluey") by heat. Such a glue enables the stack to be assembled with relative ease and without entrapping any significant amount of air between the films.

Of the various compatible glues tried, some failed because they couldn't be applied thinly enough, some failed because they couldn't dry properly, some failed apparently because they were too good insulators to allow poling to occur, while some failed apparently because they were too conductive. Others were successful—and amongst those can be singled out certain solvent-thinned nitrile rubber-based glues. Of these, that particular nitrile rubber glue available as BOSTIK 1755, diluted to 5% by weight with BOSTIK 6322 thinner (believed to be a butyl acetate mixture) (BOSTIK is a Registered Trade Mark) seems particularly acceptable, especially for use with PVDF films.

As a preliminary to step (a)—the assemblying together of the required number of films (or sheets)—it is convenient to mount suitable electrodes upon the appropriate faces of the relevant films. A typical electrode material is gold-on-chromium advantageously applied by an evaporation technique.

Step (a) may also involve the provision of protective end faces of some relatively strong, rigid and usually non-polarisable material such as a polyethylene terephthalate of the MELINEX type or a methacrylate resin of the PERSPEX type. Plates of the chosen substance may simply be pressure bonded/glued to the stack during its construction. This step may also incorporate assembly of the stack onto a rigid backing, or mounting block, which may as required be either acoustically reflective (a material such as brass or an aluminum bronze) or transparent (a material such as synthetic resin like a methacrylate—of the PERSPEX type—a polycarbonate or a polystyrene).

Steps (b), (c) and (d) above for the assembly method are, in themselves, fairly well known as regards the polarising of single sheets. Briefly, however, the following points may be made in relation to the steps per se and as applied to a stack:

(1) After assembly of the films, the whole is heated to near the deflection point of the film plastics substance. The actual temperature seems not to be very critical. Thus, for the preferred plastics substance PVDF (whose deflection temperature is 140° C.) a suitable temperature for the polarisation step is in the range 100° C. to 120° C.

(2) The polarising electric field applied across the stack is desirably near the highest that can be attained without breakdown; fields of 80 to 100 MV/m are perfectly adequate.

The polarising process takes a finite time—possibly as long as 30 minutes—and the assembly should be maintained at the appropriate temperature for the whole of that period.

Where the stack is in fact two or more assemblies polarised in opposition using one or more inner electrode and two outer (end face) electrodes, the expression "from end face to end face" is to be construed in relation to each individual assembly ("half" stack) making up the complete stack.

(3) After the main polarisation process is complete the assembly is allowed to cool down, with the polarising field still being applied until it reaches a temperature at which the plastics substance can no longer relax—spontaneously depolarise—upon removal of the field. Normally, in fact, the assembly is simply cooled to room temperature.

It is not clear why the laminar stack of the invention should be so much more resistant to breakdown than a comparable thickness of homogenous plastics film, though presumably at least in part this resistance is due to the basic nature of any laminate, namely that the effect of weak points in individual sheets is reduced since these are unlikely to occur in the same position in each sheet, and so are not likely to give rise to a breakdown path through the stack.

Whatever is the reason, stacks of the invention can be of a thickness—and thus of a sensitivity—far surpassing that previously attainable with thick individual films.

The stacks of the invention may find successful application in many diverse fields. While perhaps the most important is likely to be the generation and reception of acoustic energy under water, other possible applications include the generation of high potentials for spark production (as in, for example, a cigarette lighter), the construction of pressure sensitive "switches" (perhaps in array format), the detection and measurement of vibration or acceleration, the formation of audio or ultrasonic air transducers (as microphones, earphones and loudspeakers), and the construction of piezoelectric micromanipulators and display devices.

BRIEF DESCRIPTION OF THE DRAWING

The sole FIGURE is a diagram illustrating the properties of an element according to the invention.

DETAILED DESCRIPTION

The following Example is now given, though only by way of illustration, to show details of the preparation of certain embodiments of the invention.

EXAMPLE: Preparation of a PVDF piezoelectric stack

(a) Stack Assembly 25 micron thick 5 cm-square films of biaxially-orientated poly(vinyl difluoride)—PVDF—were dip coated in the nitrile-rubber-based adhesive BOSTIK 1755 (diluted to 5 wt% with BOSTIK 6322 thinner).

In each case the formed glue layer was allowed to dry completely; when dry it was about 1.5 micron thick.

A number (see Section (c) below) of these dry films were assembled in a stack between two flat plates with the addition of a pressure-equalising polyethylene layer on one side (the outer two films and a central film had previously had gold-on-chromium electrodes evaporated onto their surfaces), and the assembly was compressed in a heatable/coolable-platen hydraulic press (to exclude all air between the layers) at a pressure of 4,000 pounds per square inch (about 400 kg/cm$^2$).

(b) Stack Heating and Polarising

Maintaining the pressure, the press platens were heated to about 100° C. This reactivated the glue, and the several films then stuck to each other to form an evenly-bonded stack.

An electrical polarising voltage of 80 MV/m was then applied between the outer and inner electrodes (the assembly was essentially divided into two stacks by the central electrode; the two stacks were polarised in opposition).

The polarisation process was continued for 30 minutes (during all of which time the heating and polarising field were maintained). At the end of that period the heating was stopped, and the stack was cooled to room temperature, the polarising field being maintained the whole while.

(c) Results

The procedure of this Example was carried out a number of times to make a series of double stack (two stacks in opposition) piezoelectric elements containing 2×3, 2×4, 2×5, 2×6 and 2×10 layers, and so being 2×75, 2×100, 2×125 and 2×150 micron thick. From each formed polarised double stack was prepared a piezoelectric device in the form of a 1" (2.5 cm) diameter sound wave-to-electric signal transducer. The sensitivity of each device was determined by measuring—in microvolts output per Pascal (that is, microvolts per Newton per square meter pressure change) the electrical output resulting from a sound wave (pressure wave) with a frequency of 100 Hz; from the results is derived the "multilayer" line shown in the FIGURE of the accompanying drawings.

By way of comparison there was also made a series of acoustic transducers using single-layer PVDF piezoelectric elements of thicknesses 25, 75, 180 and 300 microns polarised with the maximum field short of breakdown. Tested in the same way, these gave the results from which was derived the "single layer" line in the FIGURE of the accompanying drawings.

The measured outputs of the various devices allow a direct comparison of their polarisability, and a consideration of the two lines in the graph shows clearly that, whereas the output (and thus polarisability) of a single thick film falls off drastically as film thickness increases beyond a certain point (about 75 micron in this case), in contradistinction the output of a multilayer film stack rises in a manner apparently directly proportional to the stack thickness.

I claim:

1. A method for the construction of a piezoelectric/pyroelectric element comprising an electrically-polarised laminar stack of individually thin polarisable plastics films, wherein each polarisable plastics film is essentially in face-to-face contact with its two neighbours, there being no significant gas space/pockets between any two adjacent films, in which method:
   (a) the required number of films of the unpolarised but polarisable plastics substance is assembled together in the form of a multilayer sandwich adjacent individual films of which are essentially in face-to-face contact;
   (b) the assembly is heated to a temperature somewhat below the deflection temperature of the plastics substance;
   (c) while still hot, a polarising electric field is applied across the assembly, from end face to end face;
   (d) while still applying the polarising field, the assembly is allowed to cool down; and
   (e) after assembly but before cooling adjacent individual films of the assembly are bonded together.

2. A method as claimed in claim 1, in which there are from 6 to 20 individual plastics films (or sheets) in the stack.

3. A method as claimed in claim 1, in which the plastics substance used to make the films from which the stack is formed is poly(vinyl difluoride).

4. A method as claimed in claim 1, in which the thickness of the individual films used to make the stack is from 15 to 50 micron.

5. A method as claimed in claim 1, in which the stack is constructed as two "half" stacks joined with the face of the film at one end of one "half" stack joined, by a central internal electrode, to the face of the film at the opposing end of the other "half" stack.

6. A method as claimed in claim 1, which is effected under a pressure across the stack's end faces of the order of from 1 to 5 tons per square inch (roughly from 200 to 1500 kg/cm$^2$).

7. A method as claimed in claim 1, in which the individual films are bonded together by means of a glue.

8. A method as claimed in claim 7, in which the glue is a solvent-thinned nitrile rubber-based glue.

* * * * *